United States Patent [19]

Ueda et al.

[11] Patent Number: 5,810,932
[45] Date of Patent: Sep. 22, 1998

[54] PLASMA GENERATING APPARATUS USED FOR FABRICATION OF SEMICONDUCTOR DEVICE

[75] Inventors: Yasuhiko Ueda; Hideaki Kawamoto; Hidenobu Miyamoto, all of Tokyo, Japan

[73] Assignee: NEC Corporation, Tokyo, Japan

[21] Appl. No.: 692,283

[22] Filed: Aug. 5, 1996

[30] Foreign Application Priority Data

Nov. 22, 1995 [JP] Japan .................................... 7-326227

[51] Int. Cl.$^6$ ................................ H05H 1/00; C23F 1/02
[52] U.S. Cl. .................................. 118/723 I; 118/723 IR; 118/723 AN
[58] Field of Search ......................... 118/723 I, 723 IR, 118/723 AP, 723 AN; 156/345; 216/68, 70; 204/298.37, 298.16

[56] References Cited

U.S. PATENT DOCUMENTS

| | | | |
|---|---|---|---|
| 5,122,251 | 6/1992 | Campbell et al. | 204/298.06 |
| 5,476,182 | 12/1995 | Ishizuka et al. | 216/68 |
| 5,529,657 | 6/1996 | Ishii | 156/345 |
| 5,556,521 | 9/1996 | Ghanbari | 204/192.32 |
| 5,571,366 | 11/1996 | Ishii et al. | 156/345 |
| 5,587,038 | 12/1996 | Cecchi et al. | 156/345 |

FOREIGN PATENT DOCUMENTS 3-68773   3/1991   Japan .

OTHER PUBLICATIONS

Extended Abstracts (The 56th Autumn Meeting, 1995), *The Japan Society of Applied Physics*, No. 2, pp. 536 No Month.

*Primary Examiner*—Jey Tsai
*Attorney, Agent, or Firm*—Sughrue, Mion, Zinn, Macpeak & Seas, PLLC

[57] ABSTRACT

An apparatus for generating plasma, includes a cylindrical vacuum chamber made of dielectric substance, the chamber being open only at a bottom thereof and having a height of 50 mm or smaller, at least one antenna coil disposed around the chamber for receiving high frequency power therein, and at least one electromagnetic coil disposed around the antenna coil. The cylindrical vacuum chamber may be replaced with a plate made of a dielectric substance. The apparatus is operative to carry out photoresist using etching without leaving any residue under a high selection ratio to the photoresist. In addition, the etching product does not tend to adhere to the vacuum chamber, and it would be easy to remove etching product from the vacuum chamber, even if the product adheres to the vacuum chamber.

9 Claims, 10 Drawing Sheets

A: AREA WHERE RESIDUE IS PRODUCED

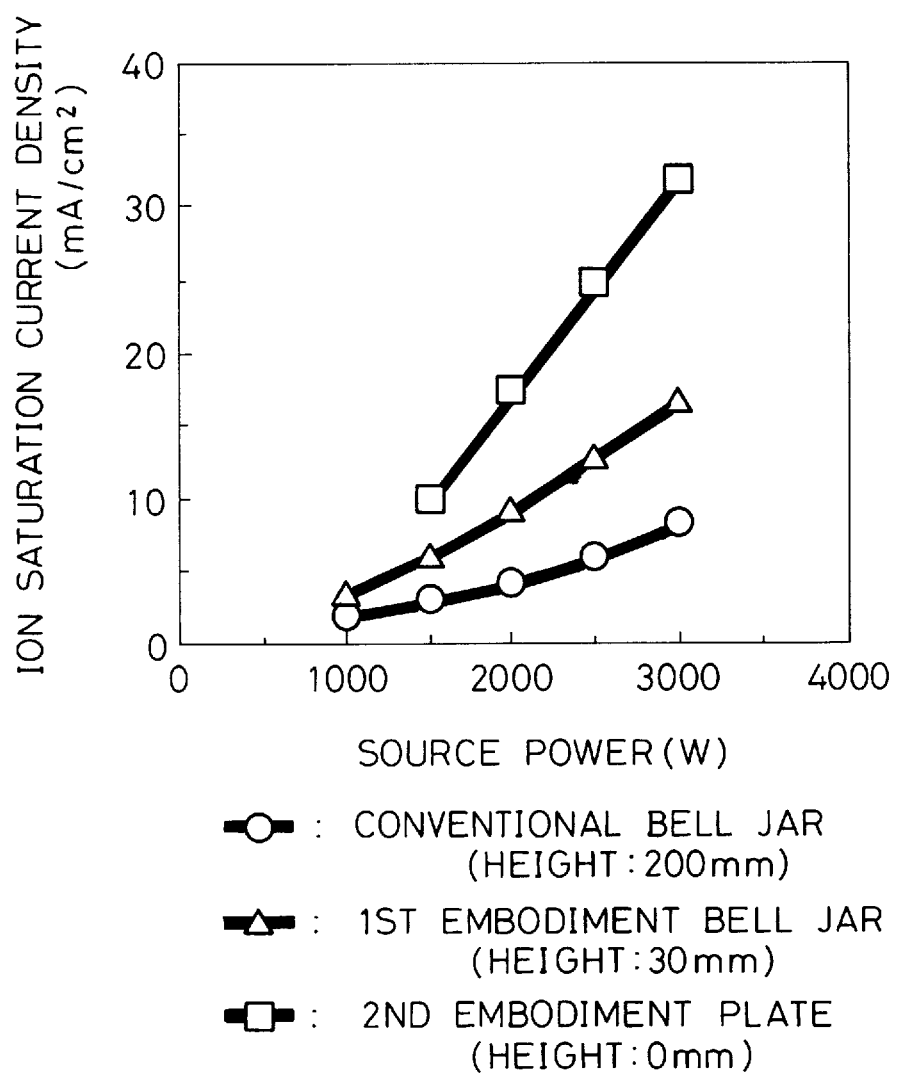

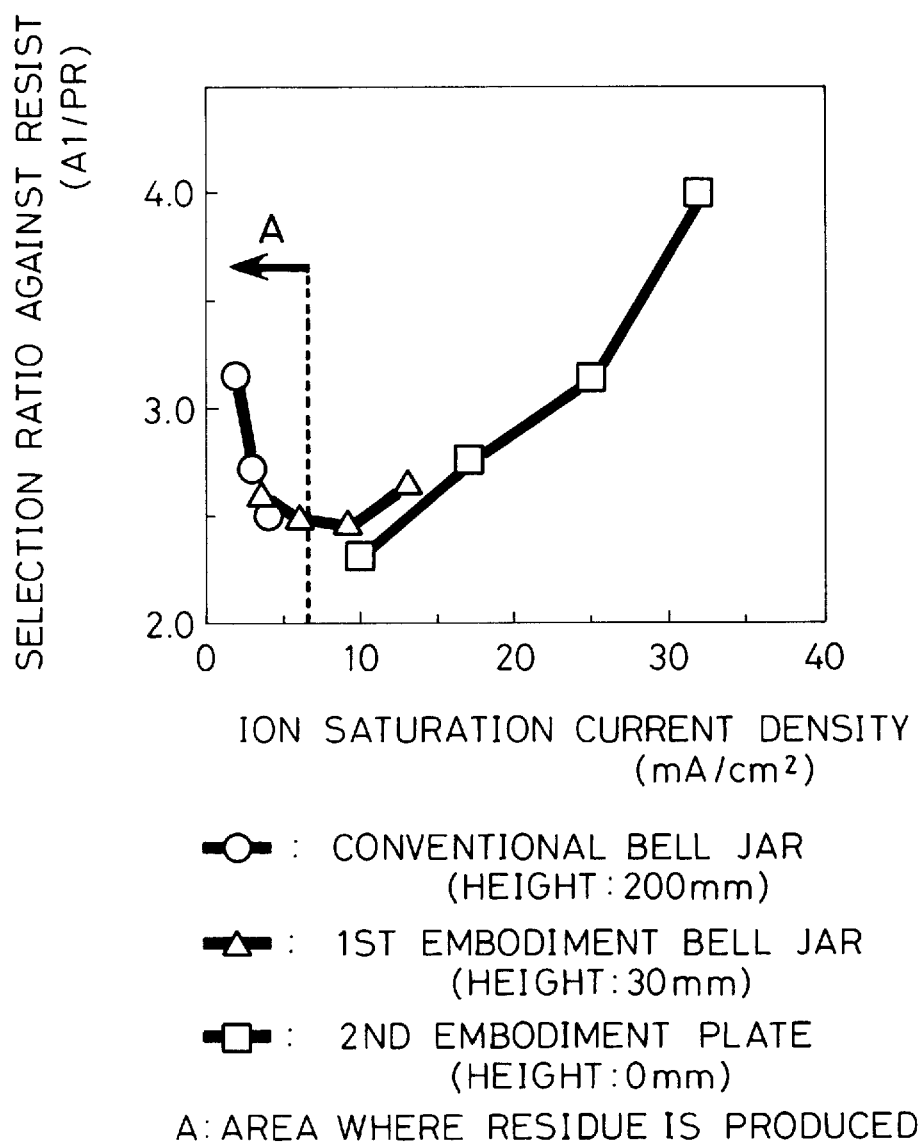

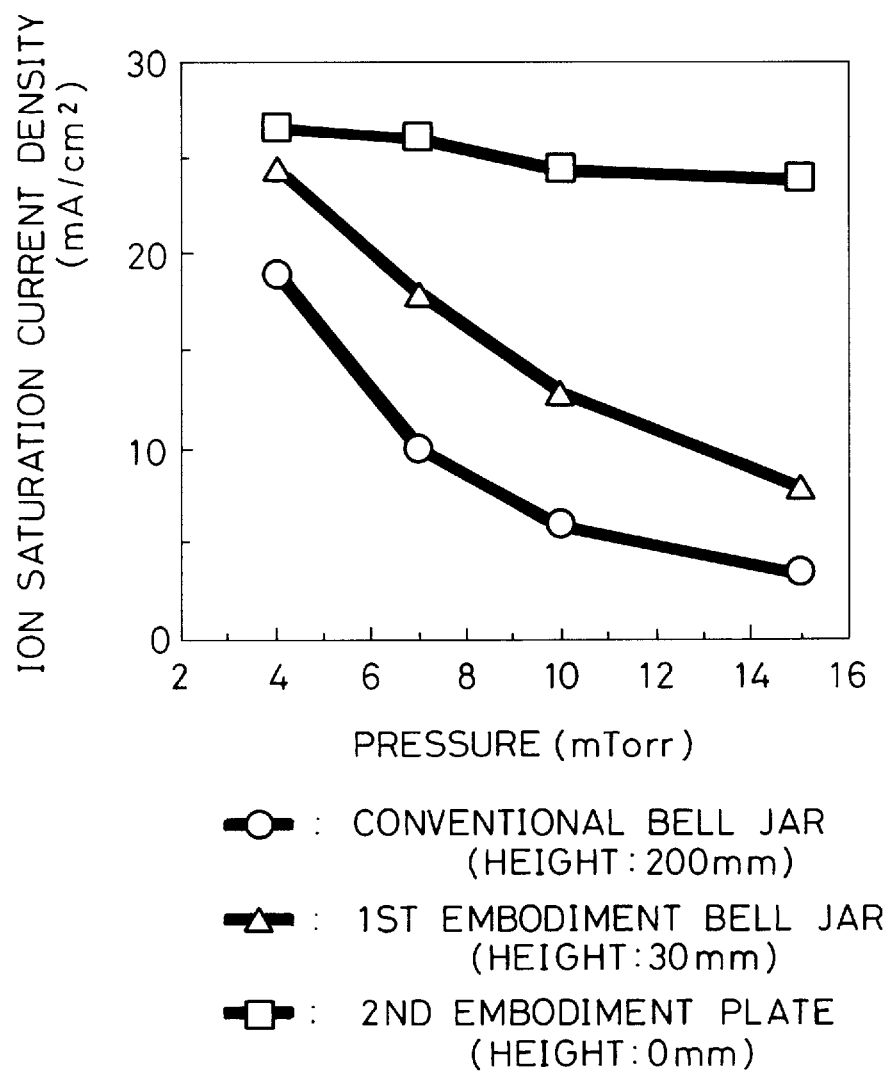

PLASMA GENERATING APPARATUS USED FOR FABRICATION OF SEMICONDUCTOR DEVICE

BACKGROUND OF THE INVENTION

1. Field of the Invention

The invention relates to an apparatus for fabricating a semiconductor device, and more particularly to a plasma generating apparatus used for fabricating semiconductor devices.

2. Description of the Related Art

There have been proposed various apparatus for generating plasma having a cylindrical vacuum chamber (hereinafter, referred to as a bell jar) made of a dielectric substance and provided with an antenna coil disposed therearound to which high frequency power is applied to generate plasma in the cylindrical vacuum chamber. A typical apparatus for generating helicon wave plasma, disclosed in Japanese Unexamined Patent Publication No. 3-68773, for example. Herein, helicon wave plasma is defined as plasma waves which would be generated in a plasma medium when a magnetostatic field is established in plasma. The phase velocity of the plasma wave is as small as the thermal velocity of electrons. As a result, electrons having almost the same velocity as the phase velocity of the helicon wave readily interacts with the helicon waves. This interactive phenomenon is so-called Landau damping. As a result of the interaction, the energy derived from the helicon waves is converted to kinetic energy of electrons, and thus there are generated high energy electrons. Due to the electrolytic dissociation of these high energy electrons, there is obtained highly densified plasma having a plasma density ranging from $10^{12}/cm^3$ to $10^{13}/cm^3$.

FIG. 1 illustrates an apparatus for generating helicon wave plasma. The apparatus includes a cylindrical bell jar 21 having an inner diameter of 100 mm and a height of 200 mm, loop-shaped upper and lower antenna coils 22 wound around the bell jar 21 and made of electrical conductor, and two coils 24 disposed surrounding the bell jar 21 and the antenna coils 22 for generating a magnetostatic field. A power supply 23 provides electrical power to the antenna coils 22 to thereby produce an electric field. Below the bell jar 21 is disposed a process chamber 25 in communication with each other. In the process chamber 25, there is disposed an electrode 27 on which a wafer 28 is placed. Around the electrode 27 are disposed a plurality of magnets 29 for generating a magnetic field in the process chamber 25.

The electric field produced by providing high frequency power to the antenna coils 22 cooperates with a magnetostatic field produced by the coils 24 to generate helicon waves plasma in the bell jar 21. The thus produced helicon waves plasma diffuses into the process chamber 25 disposed below the bell jar 21. The ion energy held in the helicon waves plasma is independently controlled by the high frequency power applied from a power supply 26 to the electrode 27. As a result, the helicon waves plasma is directed to the wafer 28 lying on the electrode 27 in controlled fashion to thereby carry out etching of the wafer 28, for instance.

If the helicon waves plasma generating apparatus as illustrated in FIG. 1 is used to thereby carry out dry-etching of an Al/Si/Cu alloy film formed on the wafer 28 by using a resist mask under a process gas including chlorine and boron trichloride gases, there would arise two problems as follows.

The first problem is that process margin is narrow. As an example, is explained hereinbelow the relation between a selection ratio against resist to be obtained when Al/Si/Cu alloy is etched by means of the above mentioned helicon waves plasma generating apparatus, and etching residue. Herein, the selection ratio against resist means a ratio of etching rate of Al/Si/Cu alloy and photoresist.

FIG. 2 shows the relation between the selection ratio against resist and etching residue when a pressure in the plasma generating apparatus is varied in the range of 4 to 15 mTorr. In FIG. 2, the ion saturation current density measured by Langmuir probe at a point about 25 mm above the wafer 28 is also illustrated in order to show the relation between the etching residue and the ion current density. In view of FIG. 2, if a high selection ratio against resist of 3.0 or greater is to be obtained, it is necessary to set the pressure in the range of 15 to 20 mTorr. However, if a conventional plasma generating apparatus was used, etching residue would be produced and thus it is not possible to apply the apparatus to an actual semiconductor fabrication process. It is understood that the dependency of the ion current density on the pressure is remarkably decreased as the pressure is increased. Thus, one reason why the etching residue is produced as the pressure is increased is that the ion saturation current density is remarkably reduced as the pressure is increased.

FIG. 3 is similar to FIG. 2, but shows the dependency of both the selection ratio against resist and the ion saturation current density on source power. Herein, source power means the power supplied to the antenna coils 22 from the power supply 23. It is understood in view of FIG. 3 that a higher selection ratio against resist is obtained for the lower source power. However, as the source power is decreased, the ion saturation current density is reduced and thereby etching residue is produced. Namely, it is very difficult to suppress the production of etching residue and carry out etching in a high selection ratio against resist, if the above mentioned conventional helicon waves plasma generating apparatus is to be used. Thus, the use of the conventional apparatus would be a hindrance to fabrication of semiconductor devices.

The second problem is that product by etching tends to be deposited on a ceiling of the bell jar in the helicon waves plasma generating apparatus and, in addition, it is very difficult to clean the inside of the bell jar, because the bell jar is elongated in shape. The reasons of the tendency of etching product to be deposited in a ceiling of the bell jar are that the bell jar is cooled in particular at a ceiling thereof because the ceiling receives cooling wind from cooling fans disposed on the ceiling of the bell jar, and that the product caused by ions receives almost no sputtering effect on the ceiling of the bell jar, because a top of the bell jar projects above the loop antennas by about 60 mm.

SUMMARY OF THE INVENTION

In view of the foregoing problems of the conventional plasma generating apparatus, it is an object of the present invention to provide a plasma generating apparatus capable of carrying out photoresist using etching without leaving any residue under a high selection ratio against the photoresist, and further capable of making it difficult for etching product to adhere to a bell jar and readily removing etching product from the bell jar, even if the product adheres to the bell jar.

The present invention provides an apparatus for generating plasma including a cylindrical vacuum chamber made of dielectric substance, the chamber being open only at a bottom thereof and having a height of 50 mm or smaller, at least one antenna coil disposed around the chamber for receiving high frequency power therein, and at least one electromagnetic coil disposed around the antenna coil.

The present invention further provides an apparatus for generating plasma including a plate made of dielectric substance, at least one antenna coil disposed above the chamber for receiving high frequency power therein, and at least one electromagnetic coil disposed around the antenna coil.

It is preferable that the cylindrical vacuum chamber has a height of 30 mm or smaller, and is made of quartz or alumina ceramic.

In accordance with the present invention, the cylindrical vacuum chamber is designed to have a height of 50 mm or smaller, preferably 30 mm or smaller, and most preferably 0 mm. In the last case, the cylindrical vacuum chamber is formed as a plate. By designing the cylindrical vacuum chamber to have a height in the above mentioned range, it is possible to increase plasma density in the vicinity of the wafer in the pressure range between 10 and 20 mTorr, and hence, it is also possible to suppress the production of residue in the pressure range between 10 and 20 mTorr in which range is obtainable a high selection ratio against photoresist. This is because plasma is to be produced at a point much lower than a conventional apparatus by using a low bell jar or a plate made of dielectric substance, which makes it easier to introduce ions and/or radicals into the process chamber, thereby the diffusion loss caused by an inner wall of the bell jar being decreased.

In addition, the present invention makes it difficult for etching product to deposit on a ceiling of a bell jar and also makes it easy to remove the deposited etching product, even if the residue is adhered to a ceiling of a bell jar. Thus, it is possible to solve a problem of the deposition on a ceiling of a bell jar. This is because the present invention enhances uniformity in temperature of the bell jar and the plate by using a bell jar or a plate having a much smaller height than a bell jar used in a conventional plasma generating apparatus.

BRIEF DESCRIPTION OF THE DRAWINGS

The above and other objects and advantageous features of the present invention will be made apparent from the following description made with reference to the accompanying drawings, in which like reference characters designate the same or similar parts throughout the drawings, in which:

FIG. 8 is a graph showing the dependency of ion saturation current density on source power in both a conventional plasma generating apparatus and the apparatus illustrated in FIGS. 4 and 7;

FIG. 9 is a graph showing the relation between a selection ratio against resist and residue production area in both a conventional plasma generating apparatus and the apparatus illustrated in FIGS. 4 and 7; and FIG. 10 is a graph showing the dependency of ion saturation current density on pressure in both a conventional plasma generating apparatus and the apparatuses illustrated in FIGS. 4 and 7.

DESCRIPTION OF THE PREFERRED EMBODIMENTS

Figure 1:
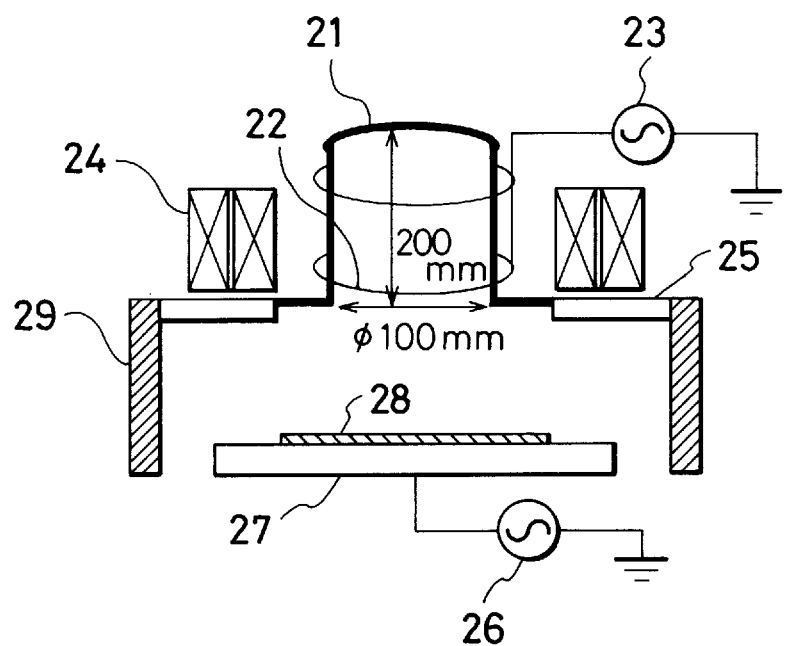
FIG. 1 is a schematic view illustrating a conventional helicon waves plasma generating apparatus.
Figure 2:
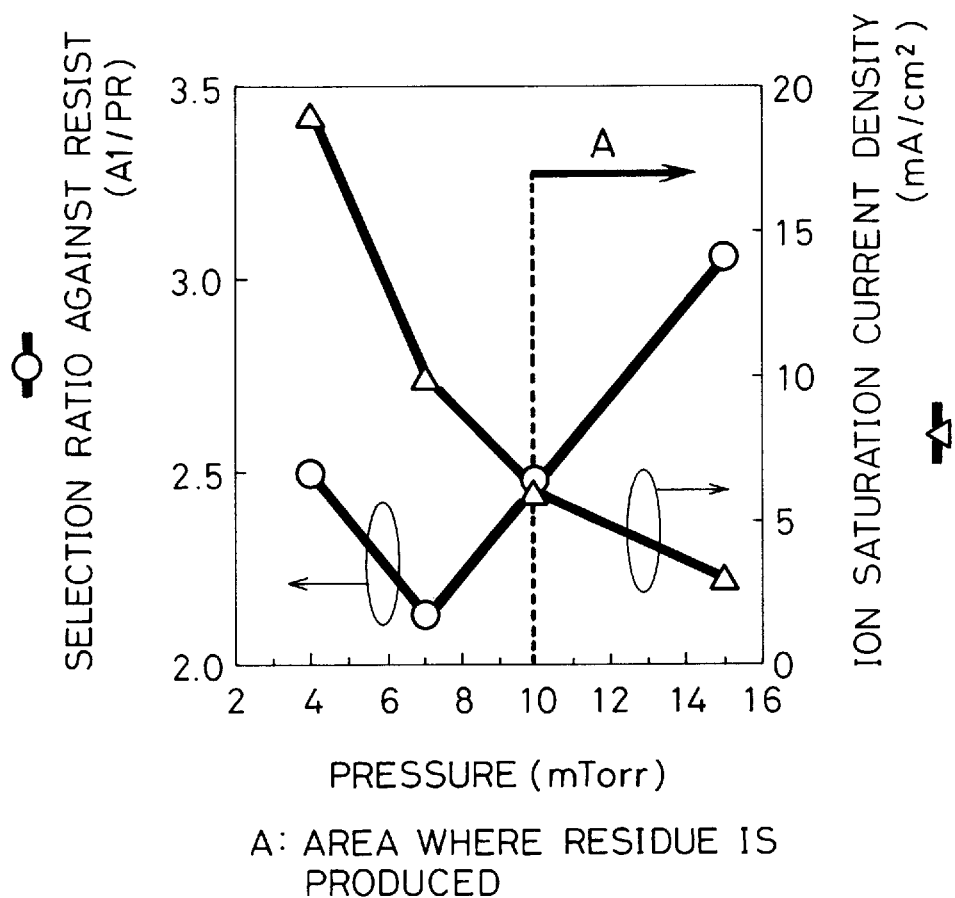
FIG. 2 is a graph showing the dependency on pressure of both a selection ratio against resist and ion saturation current density in the apparatus illustrated in FIG. 1.
Figure 3:
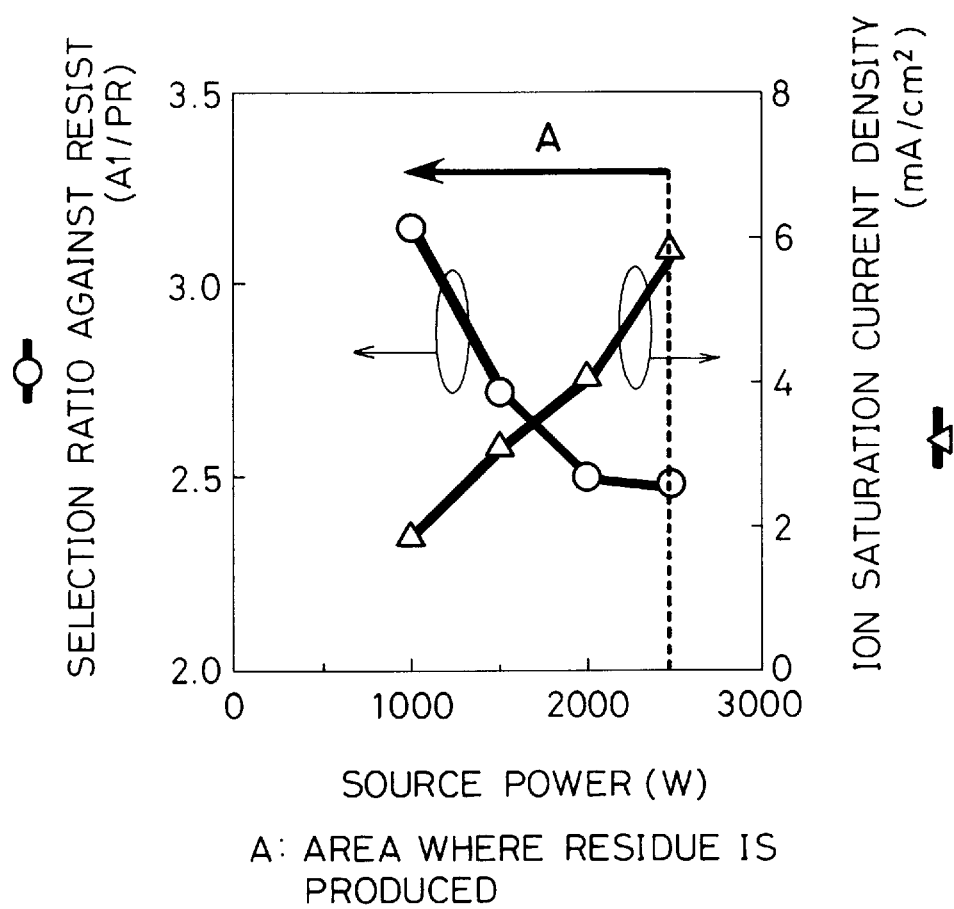
FIG. 3 is a graph showing the dependency on source power of both a selection ratio against resist and ion saturation current density in the apparatus illustrated in FIG. 1.
Figure 4:
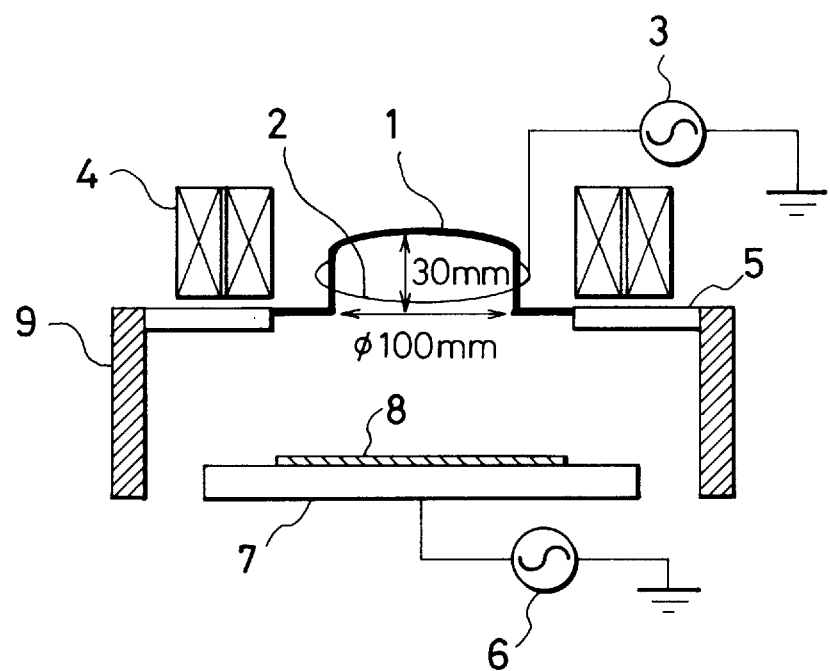
FIG. 4 is a schematic view illustrating a plasma generating apparatus made in accordance with the first embodiment of the present invention.

With reference to FIG. 4, a plasma generating apparatus made in accordance with the first embodiment includes a cylindrical bell jar 1 made of quartz and having an inner diameter of 100 mm and a height of 30 mm which is lower than that of the conventional plasma generating apparatus illustrated in FIG. 1, a loop-shaped antenna coil 2 wound around the bell jar 1 and made of electrical conductor, and two coils 4 disposed surrounding the bell jar 1 and the antenna coil 2 for generating magnetostatic field around the bell jar 1. A power supply 3 provides electrical power to the antenna coil 2 to thereby produce an electric field around the bell jar 1.

Below the bell jar 1 is disposed a process chamber 5 in communication with each other. In the process chamber 5, there is disposed an electrode 7 on which a wafer 8 is placed. A power supply 6 provides high frequency power to the electrode 7. A plurality of magnets 9 are disposed around the electrode 7 in order to generate a magnetic field in the process chamber 5.

The illustrated plasma generating apparatus operates in the same fashion as the conventional apparatus illustrated in FIG. 1. An electric field produced by providing high frequency power to the antenna coil 2 cooperates with a magnetostatic field produced by the coils 4 to generate helicon waves plasma in the bell jar 1. The thus produced helicon waves plasma diffuses into the process chamber 5. The ion energy in the helicon waves plasma is independently controlled by the high frequency power applied from the power supply 6 to the electrode 7. As a result, the helicon waves plasma is directed to the wafer 8 lying on the electrode 7 in controlled fashion, thereby etching the wafer 8.

Figure 5:
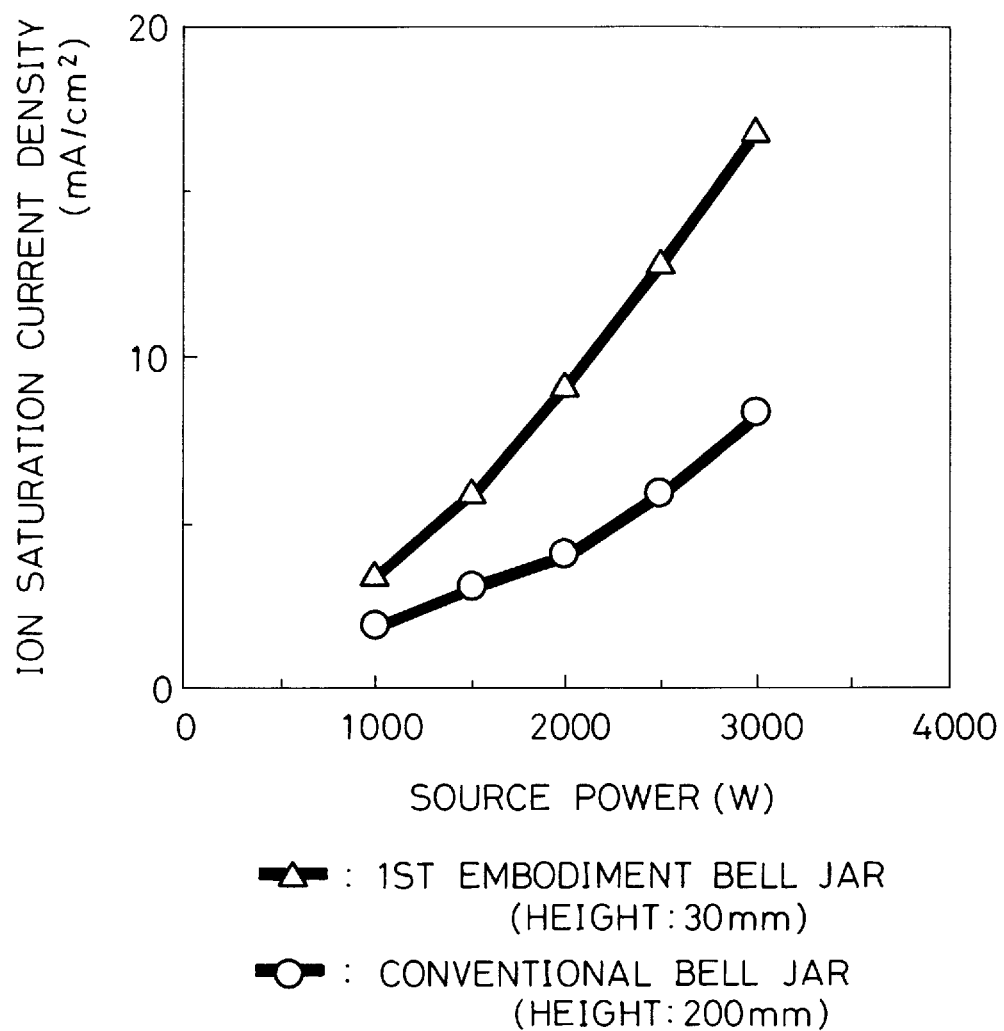
FIG. 5 is a graph showing the dependency of ion saturation current density on source power in both a conventional plasma generating apparatus and the apparatus illustrated in FIG. 4.

With respect to the plasma generating apparatus having the above mentioned structure, measurements were made as to plasma characteristics and etching characteristics. FIG. 5 shows the result of the measurement, namely the dependency of ion saturation current density on source power. Herein, source power means the power supplied to the antenna coil 2 from the power supply 3. FIG. 5 also shows the results of the measurement on a conventional helicon waves plasma generating apparatus for comparison. The conditions for discharge were as follows.

Gas flow rate: $Cl_2/BCl_3$=80 sccm/20 sccm

Pressure: 10 mTorr

Current running through coils for producing a magnetic field: IN/OUT=40A/40A (As a result, a produced magnetic field has a magnitude of about 100 G in the vicinity of the antenna coils.)

Bias Power: 140 W

Plasma measurement was carried out by means of Langmuir probe at about 180 mm below a bottom of the bell jar 1 or 21, that is, about 25 mm above the wafer 8 or 28. As is obvious in FIG. 5, the bell jar 1 having a height of 30 mm can provide higher plasma density than the bell jar 21 having a height of 200 mm of the conventional plasma generating apparatus illustrated in FIG. 1 at a pressure of about 10 mTorr. A difference in plasma density between the bell jars 1 and 21 becomes greater as the source power is increased.

Figure 6:
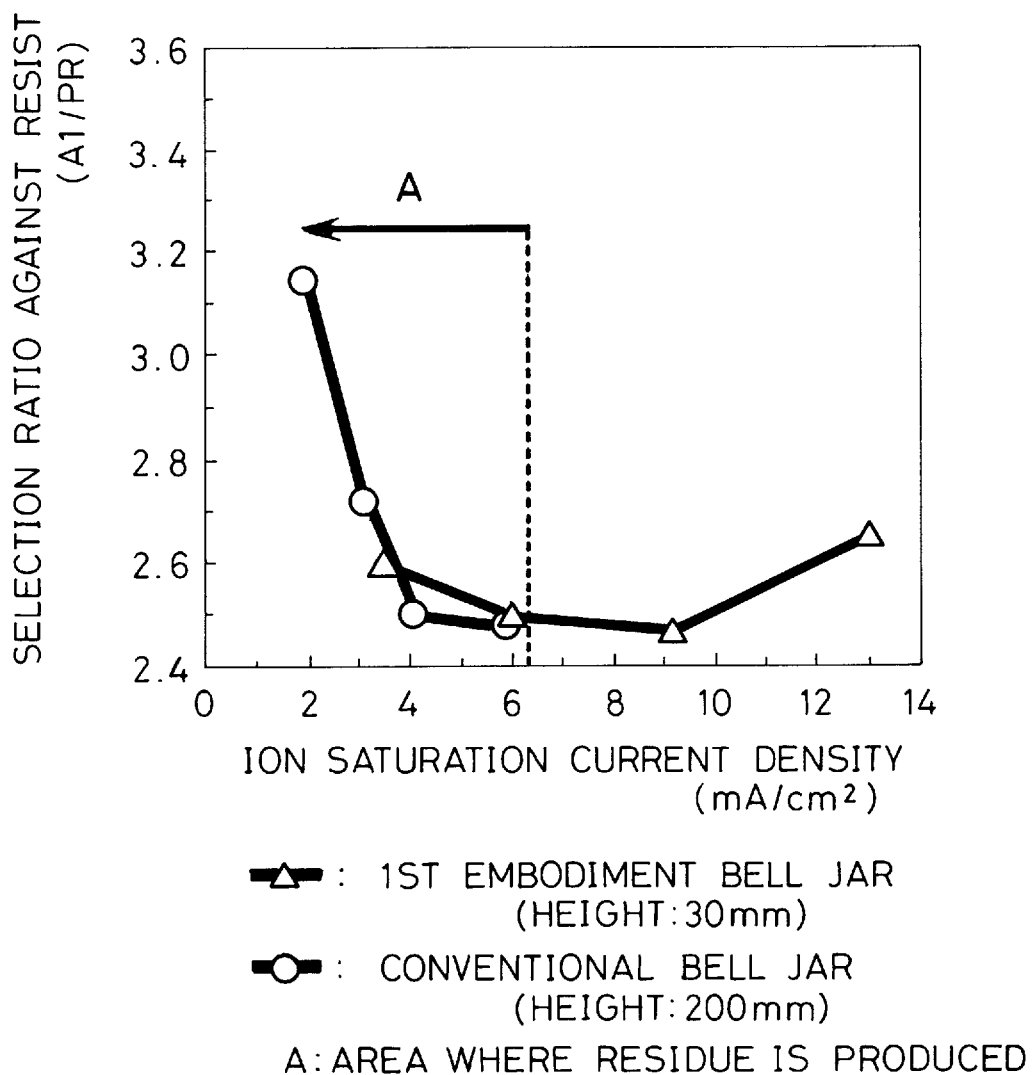
FIG. 6 is a graph showing the relation between a selection ratio against resist and residue production area in both a conventional plasma generating apparatus and the apparatus illustrated in FIG. 4.

The relation between ion saturation current density and production of residue, to be found when etching is carried out by means of the plasma generating apparatus illustrated in FIG. 4, was inspected. The results are shown in FIG. 6. The conditions for discharge and plasma analysis are the same as the measurement in FIG. 5. As is obvious in view of FIG. 6, the conventional bell jar can not suppress the production of residue, even if 2500 W source power is applied thereto, whereas the bell jar having a height of 30 mm made in accordance with the embodiment can suppress the production of residue over an entire surface of a 6-inch wafer, if at least 2000 W source power is applied thereto.

Furthermore, the etching characteristic was also tested when 2500 W source power is applied to the plasma generating apparatus made in accordance with the embodiment. The results were as follows.

Al etching rate: 1.08 $\mu$m/min

Uniformity of Al etching within a 6-inch wafer: ±3.3%

Selection ratio against resist: 2.7

In order to know how the deposition adhered to an inner wall of the bell jar 1 proceeds during plasma generation, how much degree an inner wall of the bell jar was stained with the deposition was visually inspected after about 5000 wafers had been etched in succession by means of the plasma generating apparatus. A wafer used in the successive etching had a structure of photoresist/AlSiCu/SiO$_2$ underlying layer. The conditions for discharge was the same as those for FIG. 5. The result was that there was found no deposition adhered to an inner wall of the bell jar.

Figure 7:
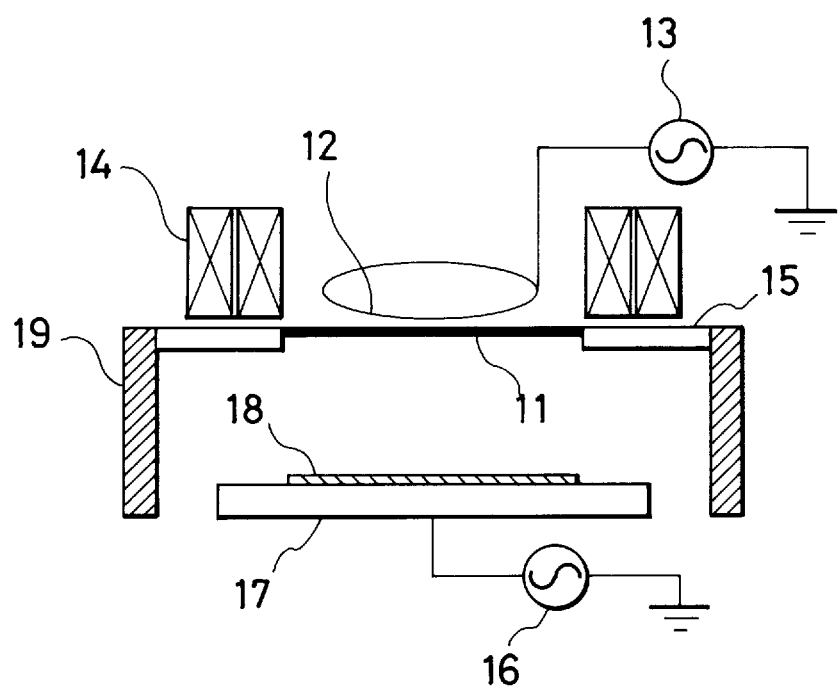
FIG. 7 is a schematic view illustrating a plasma generating apparatus made in accordance with the second embodiment of the present invention.

Turning to FIG. 7, a plasma generating apparatus made in accordance with the second embodiment includes a plate 11 made of quartz and having a diameter of 150 mm and a thickness of 5 mm, a loop-shaped antenna coil 12 made of electrical conductor and disposed 8 mm above the plate 11, and two coils 14 disposed surrounding the plate 11 and the antenna coil 12 for generating magnetostatic field around the plate 11. A power supply 13 provides electrical power to the antenna coil 12 to thereby produce an electric field around the plate 11.

Below the plate 11 is disposed a process chamber 15, which is in communication with the plate 11. In the process chamber 15, there is disposed an electrode 17 on which a wafer 18 is placed. A power supply 16 provides high frequency power to the electrode 17. A plurality of magnets 19 are disposed around the electrode 17 in order to generate a magnetic field in the process chamber 15.

The illustrated plasma generating apparatus operates in the same way as the apparatus illustrated in FIG. 4. An electric field produced by the antenna coil 12 and a magnetostatic field produced by the coils 14 cooperate with each other to generate helicon waves plasma just below the plate 11. The thus produced helicon waves plasma diffuses into the process chamber 15. The ion energy in the helicon waves plasma is independently controlled by the high frequency power applied from the power supply 16 to the electrode 17. As a result, the helicon waves plasma is directed to the wafer 18 lying on the electrode 17 in controlled fashion, thereby etching the wafer 18.

With respect to the plasma generating apparatus having the above mentioned structure, measurements were made as to plasma characteristics and etching characteristics. FIG. 8 shows the results of the measurement, namely the dependency of ion saturation current density on source power. FIG. 8 also shows the results of the measurement on both a conventional helicon waves plasma generating apparatus and the apparatus of the first embodiment including the bell jar 1 having a height of 30 mm for comparison. The conditions for discharge were as follows.

Gas flow rate: Cl$_2$/BCl$_3$=80 sccm/20 sccm

Pressure: 10 mTorr

Current running through coils for producing a magnetic field: IN/OUT=40A/40A (As a result, a produced magnetic field has a magnitude of about 100 G in the vicinity of the antenna coils.)

Bias Power: 140 W

Plasma measurement was carried out by means of Langmuir probe at about 180 mm below a bottom of the bell jar 1 or 21 or below the plate 11, that is, about 25 mm above the wafer 8, 28 or 18. As is obvious in FIG. 8, the bell jar having a smaller height can provide higher plasma density at a pressure of about 10 mTorr. Herein, the plate 11 is considered to be a bell jar having a zero height. A difference in plasma density among the bell jars 1, 21 and the plate 11 becomes greater as the source power is increased.

The relation was inspected between ion saturation current density and production of residue, to be found when etching is carried out by means of the three plasma generating apparatus: a conventional one including the bell jar having a height of 200 mm; the apparatus in accordance with the first embodiment having the bell jar including a height of 30 mm; and the apparatus in accordance with the second embodiment including the plate which is considered to be a bell jar having a height of zero mm. The results are shown in FIG. 9. The conditions for discharge and plasma analysis are the same as the measurement in FIG. 8. As is obvious in view of FIG. 9, the apparatus including a bell jar having a smaller height can provide higher ion saturation current density and hence makes it possible to carry out etching without production of residue under a higher selection ratio against photoresist. In particular, the plate provides most advantageous effects than the bell jars having a certain height.

Furthermore, the etching characteristic was also tested when 2500 W source power is applied to the plasma generating apparatus made in accordance with the second embodiment. The results were as follows.

Al etching rate: 1.05 $\mu$m/min

Uniformity of Al etching within a 6-inch wafer: ±3.9%

Selection ratio against resist: 3.0

In order to know how the deposition adhered to a surface of the plate 11 proceeds during plasma generation, the degree a surface of the plate was stained with the deposition was visually inspected after about 5000 wafers had been etched in succession by means of the plasma generating apparatus. A wafer used in the successive etching had a structure of photoresist/AlSiCu/SiO$_2$ underlying layer. The conditions for discharge was the same as those for FIG. 5. The result was that there was found no deposition adhered to a surface of the plate.

In the first and second embodiments, both of the bell jar 1 and the plate 11 are made of quartz. Even if the bell jar 1 and the plate 11 are made of alumina ceramic, it is confirmed that there can be obtained the same advantageous effects.

As will be understood in view of the structure of the bell jar and the plate in the first and second embodiments, each of the bell jar and the plate has a smaller height than a bell jar included in a conventional helicon waves plasma generating apparatus. Accordingly, plasma is generated at a lower point than a conventional apparatus, thereby ions and radicals being readily introduced into a process chamber. Thus, the diffusion loss to an inner wall of a bell jar is decreased, and accordingly the plasma density in the vicinity of a wafer is increased.

FIG. 10 shows comparison as to the dependency of ion saturation current density on pressure among a conventional plasma generating apparatus as illustrated in FIG. 1, the apparatus illustrated in FIG. 4 including a bell jar having a smaller height than a bell jar included in a conventional apparatus, and the apparatus illustrated in FIG. 7 including a plate made of dielectric substance. As is obvious in FIG. 10, a bell jar having a smaller height provides higher ion saturation current density. In particular, by using the plate made of dielectric substance, the ion saturation current density is scarcely decreased even in a pressure range from 10 to 15 mTorr. Accordingly, it is possible to obtain sufficient amount of ions for suppressing the production of etching residue.

Since the bell jar and the plate have a smaller height than a bell jar included in a conventional plasma generating apparatus, it is possible to enhance the uniformity in temperature in the bell jar or the plate, and hence the deposition would not adhere to a ceiling of the bell jar or the plate. Even if the deposition adheres to a ceiling of the bell jar or the plate, the deposition could be readily washed off.

While the present invention has been described in connection with certain preferred embodiments, it is to be understood that the subject matter encompassed by way of the present invention is not to be limited to those specific embodiments. On the contrary, it is intended for the subject matter of the invention to include all alternatives, modifications and equivalents as can be included within the spirit and scope of the following claims.

What is claimed is:

1. An apparatus for generating plasma, comprising:
   a cylindrical vacuum chamber made of a dielectric substance, said chamber being open only at a bottom thereof and having a height of 50 mm or smaller;
   a single turn antenna coil disposed around said chamber for receiving high frequency power therein; and
   at least one electromagnetic coil disposed around said antenna coil.

2. The apparatus as set forth in claim 1, wherein said chamber has a height of 30 mm or smaller.

3. The apparatus as set forth in claim 1, wherein said chamber is made of quartz or alumina ceramic.

4. The apparatus as set forth in claim 1 further comprising:
   a process chamber disposed just below said cylindrical vacuum chamber, such that plasma produced in said cylindrical vacuum chamber is introduced into said process chamber;
   means for producing a magnetic field in said process chamber;
   an electrode disposed in said process chamber, a sample being placed on said electrode; and
   a high frequency power supply for providing high frequency power to said electrode.

5. The apparatus as set forth in claim 4, wherein said apparatus is operative to selectively etching aluminum and aluminum alloys by using a resist as a mask.

6. An apparatus for generating plasma, comprising:
   a plate made of a dielectric substance;
   a single turn antenna coil disposed above said plate for receiving high frequency power therein; and
   at least one electromagnetic coil disposed around said antenna coil.

7. The apparatus as set forth in claim 6, wherein said plate is made of quartz or alumina ceramic.

8. The apparatus as set forth in claim 6 further comprising:
   a process chamber disposed just below said plate, such that plasma produced adjacent to said plate is introduced into said process chamber;
   means for producing a magnetic field in said process chamber;
   an electrode disposed in said process chamber, a sample being placed on said electrode; and
   a high frequency power supply for providing high frequency power to said electrode.

9. The apparatus as set forth in claim 8, wherein said apparatus is operative to selectively etch aluminum and aluminum alloys by using a resist as a mask.

* * * * *